United States Patent [19]

Moreland

[11] Patent Number: 5,554,943
[45] Date of Patent: Sep. 10, 1996

[54] ANALOG TO DIGITAL CONVERTER HAVING A MAGNITUDE AMPLIFIER WITH AN IMPROVED DIFFERENTIAL INPUT AMPLIFIER

[75] Inventor: Carl W. Moreland, Greensboro, N.C.

[73] Assignee: Analog Devices, Inc.

[21] Appl. No.: 347,704

[22] Filed: Dec. 1, 1994

[51] Int. Cl.6 .................................. H03K 5/24; H03M 1/72
[52] U.S. Cl. .......................... 327/65; 327/560; 327/563; 341/159; 341/161
[58] Field of Search .................................. 327/52, 65, 89, 327/104, 306, 560, 563; 330/252, 253, 254, 311; 341/156, 159, 161

[56] References Cited

U.S. PATENT DOCUMENTS

| | | | |
|---|---|---|---|
| 4,599,602 | 7/1986 | Matzuzawa et al. | 341/161 |
| 4,931,797 | 6/1990 | Kagawa et al. | 327/77 |
| 5,126,742 | 6/1992 | Schmidt et al. | 341/156 |
| 5,198,781 | 3/1993 | Kusakabe | 330/257 |
| 5,307,067 | 4/1994 | Kimura et al. | 341/159 |
| 5,313,207 | 5/1994 | Kouno et al. | 341/156 |
| 5,392,045 | 2/1995 | Yee | 327/65 |
| 5,399,988 | 3/1995 | Knierim | 330/252 |

*Primary Examiner*—Timothy P. Callahan
*Assistant Examiner*—Terry L. Englund
*Attorney, Agent, or Firm*—Hale and Dorr

[57] ABSTRACT

An improved magnitude amplifier (magamp) is provided for a serial-type A/D converter. The magamp includes an improved differential input amplifier circuit to which offset circuitry is connected. These elements may be implemented in a single integrated circuit chip or as separate discrete circuits in hardware. The differential input amplifier circuit includes two pairs of differential input transistors, a comparator, and current switching control transistors. The comparator provides outputs that drive the current switching control transistors. The current switching control transistors are connected below the input transistors and not above the input transistors to reduce the parasitic capacitive loading at the outputs of the differential input amplifier circuit and increase the speed of the magamp. The offset circuitry provides the appropriate signals for aligning the output signals for output to the next stage magamp.

20 Claims, 4 Drawing Sheets

5,554,943

ANALOG TO DIGITAL CONVERTER HAVING A MAGNITUDE AMPLIFIER WITH AN IMPROVED DIFFERENTIAL INPUT AMPLIFIER

FIELD OF THE INVENTION

The present invention relates to analog-to-digital converters. More specifically, the present invention relates magnitude amplifiers that are used in high speed, low voltage serial-type analog-to-digital converters.

BACKGROUND OF THE INVENTION

There are a variety of analog-to-digital ("A/D") converters. For example, there are parallel encoder (or flash) A/D converters, multistage A/D converters, successive approximation A/D converters, voltage-to-frequency A/D converters, dual-ramp A/D converters, and staircase A/D converters. There is such a variety because the need for converters has heightened with the advent of single-chip large scale integration ("LSI") microprocessors. In fact, in some cases, it is desirable to include such converters on the same chip with the microprocessor.

In many cases, there is the desire to have very fast conversion to maintain the speed of the overall system. The types of A/D converters typically used in these situations have been flash and multistage flash A/D converters. As larger and larger A/D converters were being constructed, the resulting large dies had a great deal of parasitics that had to be driven. This forced the technology in the opposite direction, which was to make the A/D converters smaller and smaller. This brought about the advent of the consideration of replacing flash and multistage flash A/D converters with serial-type A/D converters because in many ways they were easier to construct on a chip than multistage flash A/D converters and they can, in some cases, achieve the speed of flash A/D converters with considerably less power.

Serial-type A/D converters typically convert analog signals first into Gray scale code and then into binary code. They are configured to have a series of cascaded analog cells to which the Gray scale code-to-binary processing system connects. Each cell of the series of cascaded analog cells has a folding cell that will process the differential input signals, $V_{IL}$ and $V_{IH}$, according to FIG. 1.

The signals input to the differential input of the folding cell are shown in FIG. 1A. As $V_{IH}$ increases and $V_{IL}$ decreases, there is a single crossing at 100. This is the place where the comparator of the folding cell is tripped and the $V_{IH}$ and $V_{IL}$ signals are folded to form the intermediate signals $V_1$ and $V_2$ that are shown in FIG. 1B. These intermediate signals are output from the current switching portion of the folding cell. When $V_1$ and $V_2$ are folded as shown in FIG. 1B, the folded signals converge but do not cross as shown at 102.

In order to obtain the desired $V_{OH}$ and $V_{OL}$ outputs for input to the next stage, it is necessary to further process the $V_1$ and $V_2$ signals. The processing that is necessary is to offset the $V_1$ and $V_2$ signals to align them. Once the offset has been applied, the alignment shown in FIG. 1C results. This alignment has crossing points at 104 and at 106. Thereafter, the $V_{OH}$ and $V_{OL}$ signals are input to the next stage of the serial-type A/D converter.

The folding cells of serial-type A/D converter have taken many configurations, one of which is a magnitude amplifier ("magamp") with offset circuitry that is either incorporated directly as part of the magamp or as separate circuitry that connects to the magamp. A concern of magamps, as with other types of folding cells, is the amount of parasitics that have to be driven. The greater the amount of parasitic capacitance loading that is realized, the slower the magamp, and, therefore, the A/D converter. This is of great concern because of the desire for the A/D conversion process to keep up with the remainder of the system and not constitute a bottleneck.

The present invention significantly reduces the parasitics in magamps at the load resistors. The present invention will be described in detail in the remainder of the specification referring to the drawings.

SUMMARY OF THE INVENTION

The present invention is a magamp with an improved differential input amplifier. The magamp may use an integrated offset circuit. The magamp of the present invention may be used in a serial-type A/D converter.

The improved magamp of the present invention includes a differential input amplifier circuit to which the offset circuitry connects. The improved magamp and associated input circuitry may be implemented in a single integrated circuit chip or as separate discrete circuits that are connected.

The differential input amplifier circuit includes two differential input amplifiers, a comparator, and a current switching control transistors. The differential input amplifiers share current sources, load resistors, and output nodes. Offset circuitry connects to the portions of the differential input amplifiers that are shared near the output nodes. The offset circuitry provides currents for aligning the switched signals so that the $V_{OL}$ and $V_{OH}$ outputs are aligned as shown in FIG. 1C for input to the next magamp stage.

The comparator of the magamp provides outputs that control the turning on and off of the current switching control transistors that are positioned below the input transistors, remote from the output nodes (positioned above the input transistors). This configuration reduces the parasitic capacitive loading at the output nodes. Through these switching control transistors, the pairs of differential input transistors conduct current that results in the folding of the input signals because of the cross connection of the collectors of input transistors at the shared portions of differential amplifiers.

An object of the present invention is to provide a magamp with an improved differential input amplifier.

Another object of the present invention is to provide a magamp with an improved differential input amplifier that operates with increased speed over conventional magamps.

A further object of the present invention is to provide a magamp with an improved differential input amplifier that reduces the parasitic capacitance loading in the differential input amplifiers.

These and other objects of the present invention will be described in greater detail in the remainder of the specification referring to the drawings.

DETAILED DESCRIPTION OF THE PRESENT INVENTION

The present invention is a magamp with an improved differential input amplifier circuit. The magamp connects to an integrated offset circuit and may be used in a serial-type A/D converter. This converter typically is a n-bit converter with n-1 magamps.

Figure 2:
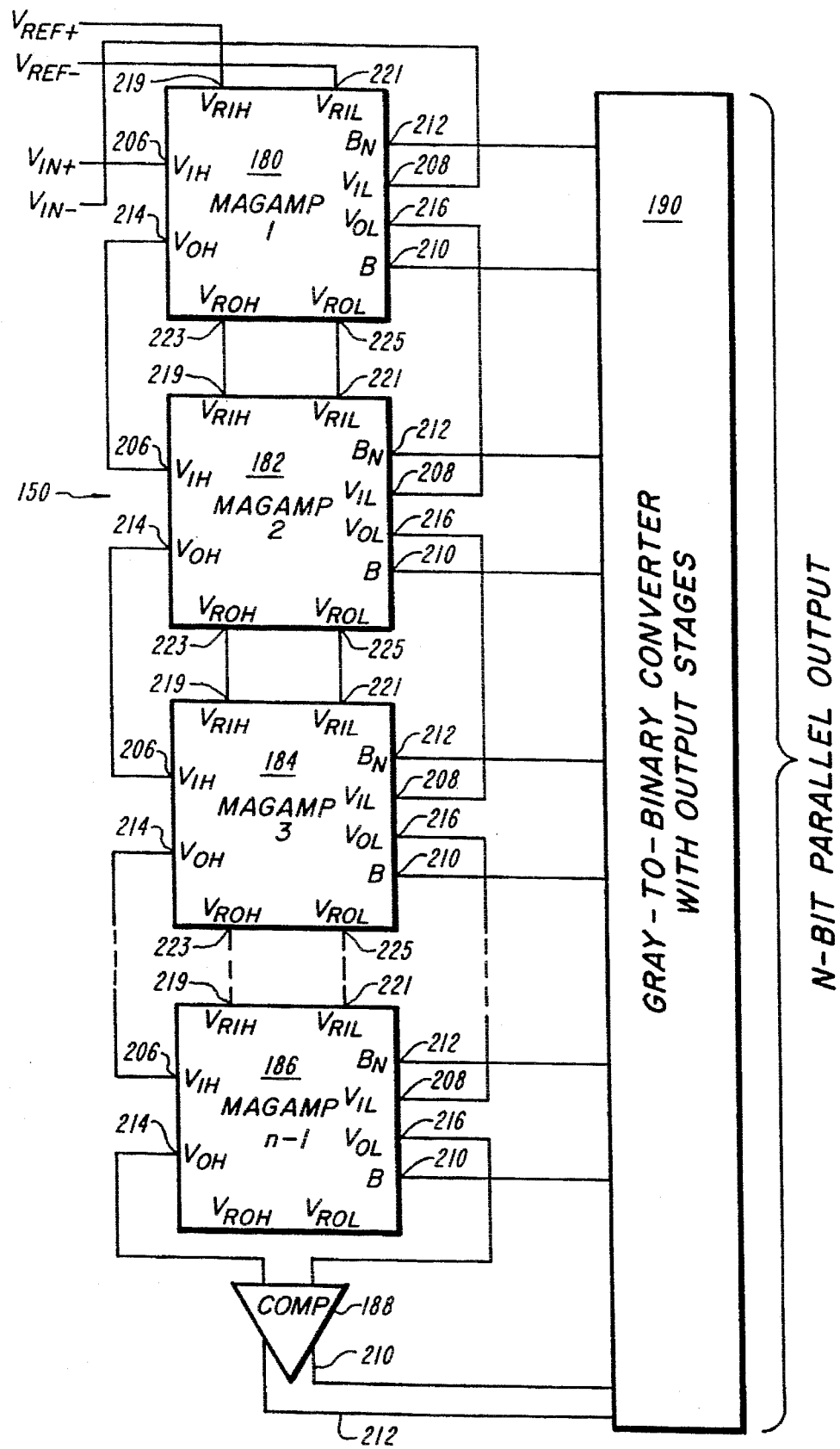
FIG. 2 shows a serial-type A/D converter into which the improved magamp of the present invention may be incorporated.

Referring to FIG. 2, a serial-type A/D converter that may use the improved magamp of the present invention is shown generally at 150. This A/D converter includes magamps 180, 182, 184, and 186, which are cascade connected, and Gray-to-binary code conversion unit with output stages 190. The output of Gray-to-binary converter with output stages is an n-bit parallel digital signal. However, it is understood that the output could be a serial digital signal.

The serial-type A/D converter shown in FIG. 2 has n-1 magamp stages. The final stage 188 does not perform amplification but acts only as a comparator.

Magamp 1, 180, has two analog inputs. This is a differential analog input to the $V_{IH}$ input at 206 and to the $V_{IL}$ input at 208. Of these inputs, $V_{IH}$ is the "+" input and $V_{IL}$ is the "−" input.

Certain outputs of magamp 1, 180, are input to magamp 2, 182. Specifically, the signal output from the $V_{OH}$ output at 214 of magamp 1, 180, is input to the $V_{IH}$ input of magamp 2, 182, at 206. Similarly, the signal output from the $V_{OL}$ output at 216 of magamp 1, 180, is input to the $V_{IL}$ input of magamp 2, 182, at 208. With regard to these outputs, $V_{OH}$ is the "+" output and $V_{OL}$ is the "−" output. This same method of connecting the $V_{OH}$ and $V_{OL}$ outputs of one stage to the $V_{IH}$ and $V_{IL}$ inputs of the next successive stage is repeated for the n-stages of the serial-type A/D converter.

Each of the n-1 magamps of the serial-type A/D converter provides a differential output to Gray-to-binary unit with output stages 190. These outputs are the B output at 210 and $B_N$ output at 212. These are the outputs from the comparator that also are used to drive the transistors that control current switching in the magamp. The signals output from the B and $B_N$ outputs are processed by Gray-to-binary converter with output stages 190 to produce the n-bit parallel digital signal.

All of the n-1 magamps in the serial-type A/D converter shown in FIG. 2 have substantially the same construction. Therefore, except as otherwise indicated, the description of magamp 1, 180, that follows, applies equally to magamp 2, 182, magamp 3, 184, and magamp n-1, 186.

Figure 3:
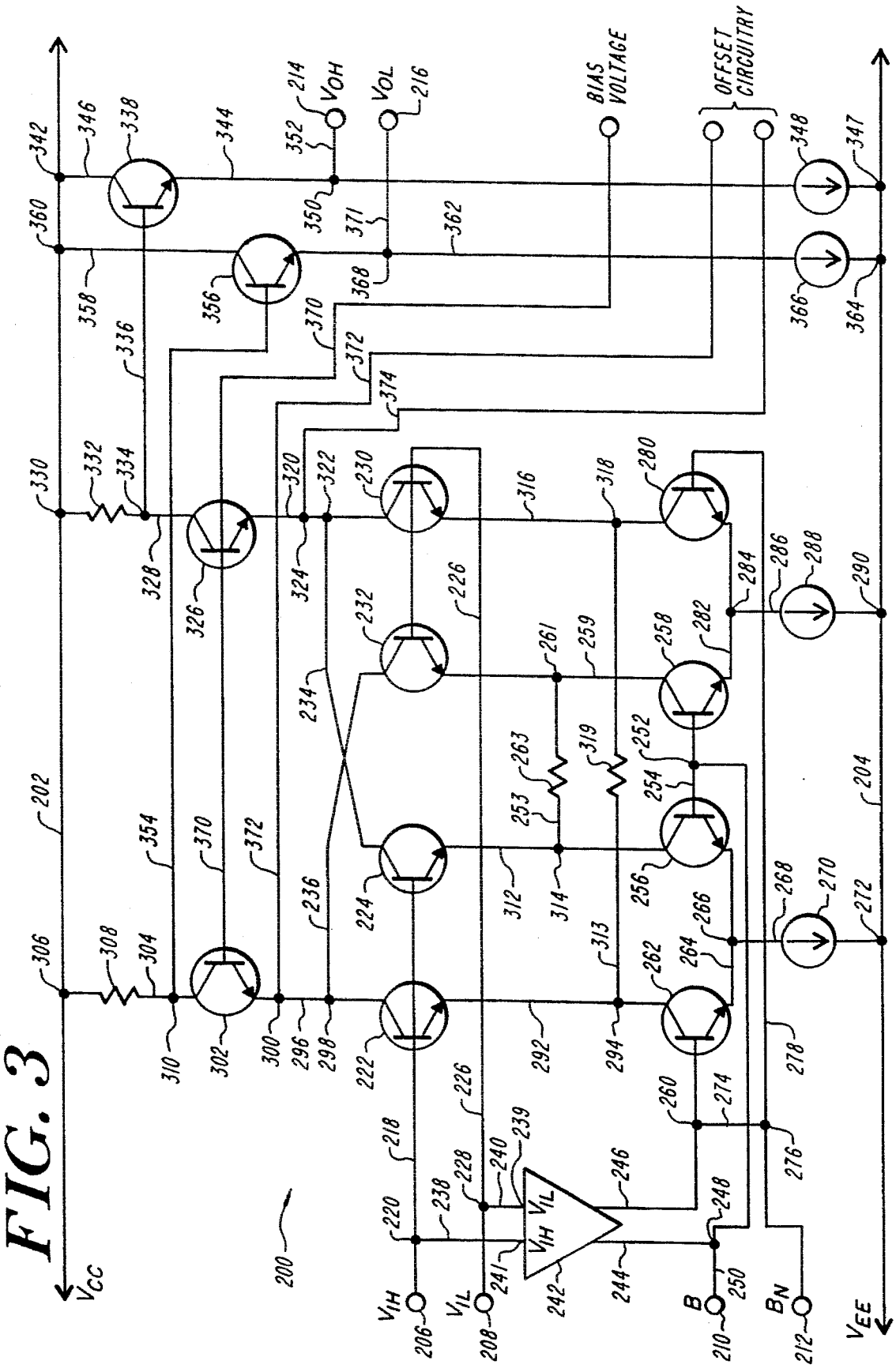
FIG. 3 is a schematic drawing of the magamp of the present invention that has an improved differential input amplifier circuit.

Referring to FIG. 3, a schematic diagram of the improved magamp of the present invention is shown generally at 200. The differential analog input to mag amp 1, 180, is input at the $V_{IH}$ and $V_{IL}$ inputs at 206 and 208, respectively. These signals are input to the differential input amplifier circuit of the magamp, which includes two pairs of differential input transistors. The first pair of input transistors are bipolar npn transistors 222 and 230 and the second pair of input transistors bipolar npn transistors 224 and 232. Each pair is associated with a differential input amplifier.

The transistors that control the switching of the currents in the differential input amplifier circuit of the magamp of the present invention are bipolar npn transistors 256, 258, 262, and 280. These transistors are connected below the pairs of differential input transistors remote from the output nodes. By positioning these transistors below the pairs of differential input transistors away from the output nodes, there is a significant reduction in the parasitic capacitive loading at the outputs, thereby increasing the speed of the magamp. The improved magamp of the present invention will now be described.

Again referring to FIG. 3, the analog signal at the $V_{IH}$ input at 206 is input to the bases of input transistors 222 and 224 via line 218. The analog signal at the $V_{IL}$ input at 208 is input to the bases of input transistors 230 and 232 via line 226. Differential input transistors 222 and 230 are associated with a first differential input amplifier and differential input transistors 224 and 232 are associated with a second. First the differential input amplifier that includes input transistors 222 and 230 will be described, then the differential input amplifier that includes input transistors 224 and 232 will be described.

The first branch of the differential input amplifier that includes input transistor 222 has line 296 that connects the collector of the input transistor 222 to the emitter of bipolar npn transistor 302. Nodes 298 and 300 are disposed in line 296. The collector of transistor 302 connects to node 306 on $V_{CC}$ 202 via line 304. Load resistor 308 is disposed in line 304 and node 310 is disposed in line 304 between transistor 302 and load resistor 308.

Line 292 connects the emitter of input transistor 222 to the collector of current switching control transistor 262, which is a bipolar npn transistor. Node 294 is disposed in line 292. The emitter of transistor 262 is connected to line 264 that couples the emitters of current switching control transistors 262 and 256. As will be explained, transistor 256, which is bipolar npn transistor, is in the first branch of the differential input amplifier that includes input transistors 224 and 232. Common node 266 is disposed in line 264. Line 268 connects node 266 to node 272 on $V_{EE}$ 204. Current source 270 is disposed in line 268.

Now referring to the second branch of the differential input amplifier that includes transistor 230, line 320 connects the collector of the input transistor 230 to the emitter of bipolar npn transistor 326. Nodes 322 and 324 are disposed in line 320. The collector of transistor 326 connects to node 330 on $V_{CC}$ 202 via line 328. Load resistor 332 is disposed in line 328 and node 334 is disposed in line 328 between transistor 326 and load resistor 332.

Line 316 connects the emitter of input transistor 230 to the collector of current switching control transistor 280, which is a bipolar npn transistor. Node 318 is disposed in line 316. The emitter of transistor 280 is connected to line 282 that couples the emitters of current switching control transistors 258 and 280. As will be explained, transistor 258, which is a bipolar npn transistor, is in the second branch of the differential input amplifier that includes input transistors 224 and 232. Common node 284 is disposed in line 282. Line 286 connects node 282 to node 290 on $V_{EE}$ 204. Current source 288 is disposed in line 286.

Line 313 connects between node 294 in line 292 and node 318 in line 316. Resistor 319 is disposed in line 313. Input transistors 222 and 230, and resistor 319 operate conventionally for linear conversion of the analog inputs.

The second differential input amplifier will now be described. It is to be noted that a portion of this differential input amplifier is common with the first differential input amplifier just described because of the switching of currents.

With respect to the first branch of the second differential input amplifier that includes input transistor 224, line 234 connects the collector of input transistor 224 to node 322 in line 320. Line 320 connects the collector of the input transistor 230 to the emitter of transistor 326. Nodes 322 and 324 are disposed in line 320. The collector of transistor 326 connects to node 330 on $V_{CC}$ 202 via line 328. Load resistor 332 is disposed in line 328 and node 334 is disposed in line 328 between transistor 326 and load resistor 332.

Line 312 connects the emitter of input transistor 224 to the collector of current switching control transistor 256, which is a bipolar npn transistor. Node 314 is disposed in line 312. The emitter of transistor 256 is connected to line 264, which, as stated, couples the emitters of current switching control transistors 256 and 262. Common node 266 is disposed in line 264. Line 268 connects node 266 to node 272 on $V_{EE}$ 204. Current source 270 is disposed in line 268.

Now regarding to second branch of the second differential input amplifier that includes input transistor 232, line 236 connects the collector of input transistor 232 to node 298 in line 296. Line 296 connects the collector of the input transistor 222 to the emitter of transistor 302. Nodes 298 and 300 are disposed in line 296. The collector of transistor 302 connects to node 306 on $V_{CC}$ 202 via line 304. Load resistor 308 is disposed in line 304 and node 310 is disposed in line 304 between transistor 302 and load resistor 308.

Line 259 connects the emitter of input transistor 232 to the collector of switching control transistor 258, which is a bipolar npn transistor. Node 261 is disposed in line 259. The emitter of transistor 258 is connected to line 282, which, as stated, couples the emitters of switching control transmitters 258 and 280. Common node 284 is disposed in line 282. Line 286 connects node 284 to node 290 on $V_{EE}$ 204. Current source 288 is disposed in line 286.

Line 253 connects between node 314 in line 312 and node 261 in line 259. Resistor 263 is disposed in line 253. Input transistors 224 and 232, and resistor 263 operate conventionally for linear conversion of the analog inputs.

Figure 1A:
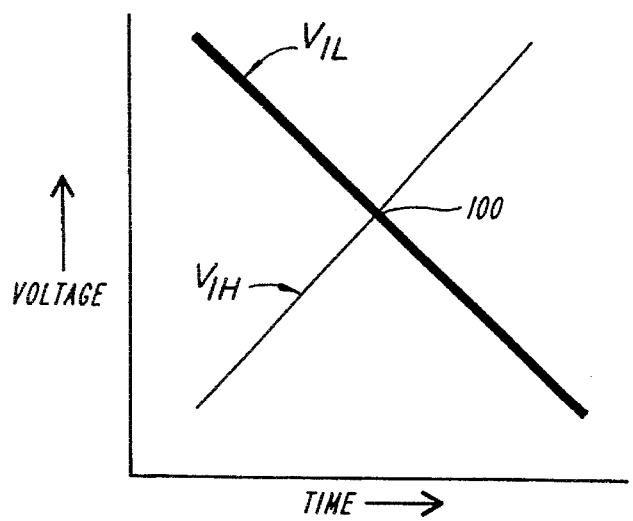
FIG. 1A is a graph of inputs to serial-type A/D converter that has a folding cell.
Figure 1B:
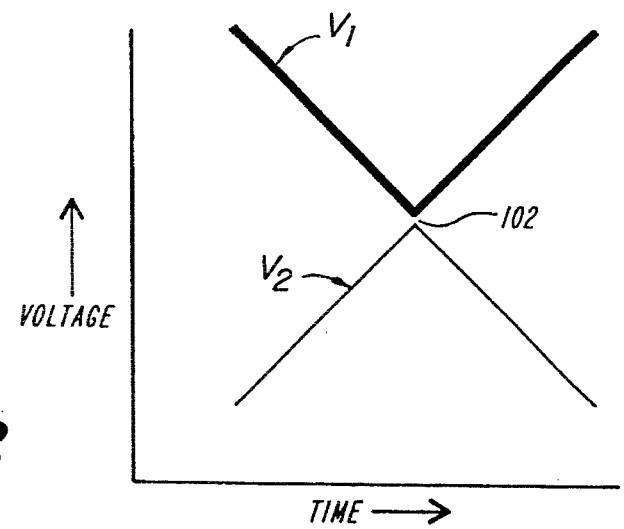
FIG. 1B is a graph of the intermediate folded signals of a serial-type A/D converter that has a folding cell.
Figure 1C:
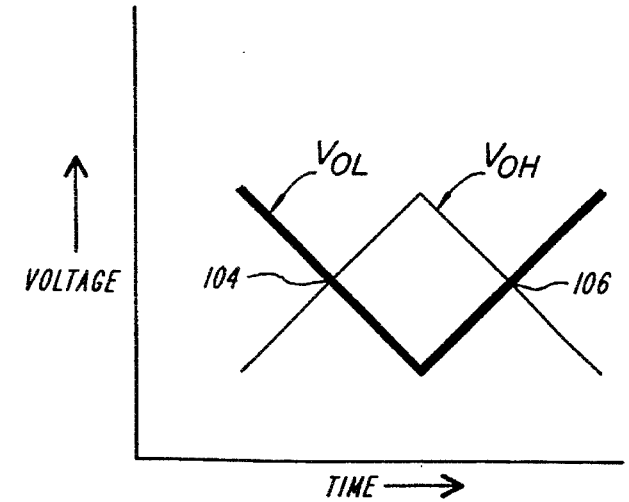
FIG. 1C is a graph of outputs of a serial-type A/D converter that has a folding cell and such outputs have been aligned for input to a next stage of the serial-type A/D converter.

The dual differential input amplifier arrangement just described will operate to properly fold the differential analog input as shown in FIG. 1C because of the way current switching control transistors 256, 258, 262, and 280 are placed in conducting and non-conducting states. The control of these transistors will now be described.

The differential analog input at the $V_{IH}$ and $V_{IL}$ inputs at 206 and 208, also is input to comparator 242 at 241 and 239. The signals output from comparator 242 are used to drive the current switching control transistors 256, 258, 262, and 280.

Figure 4:
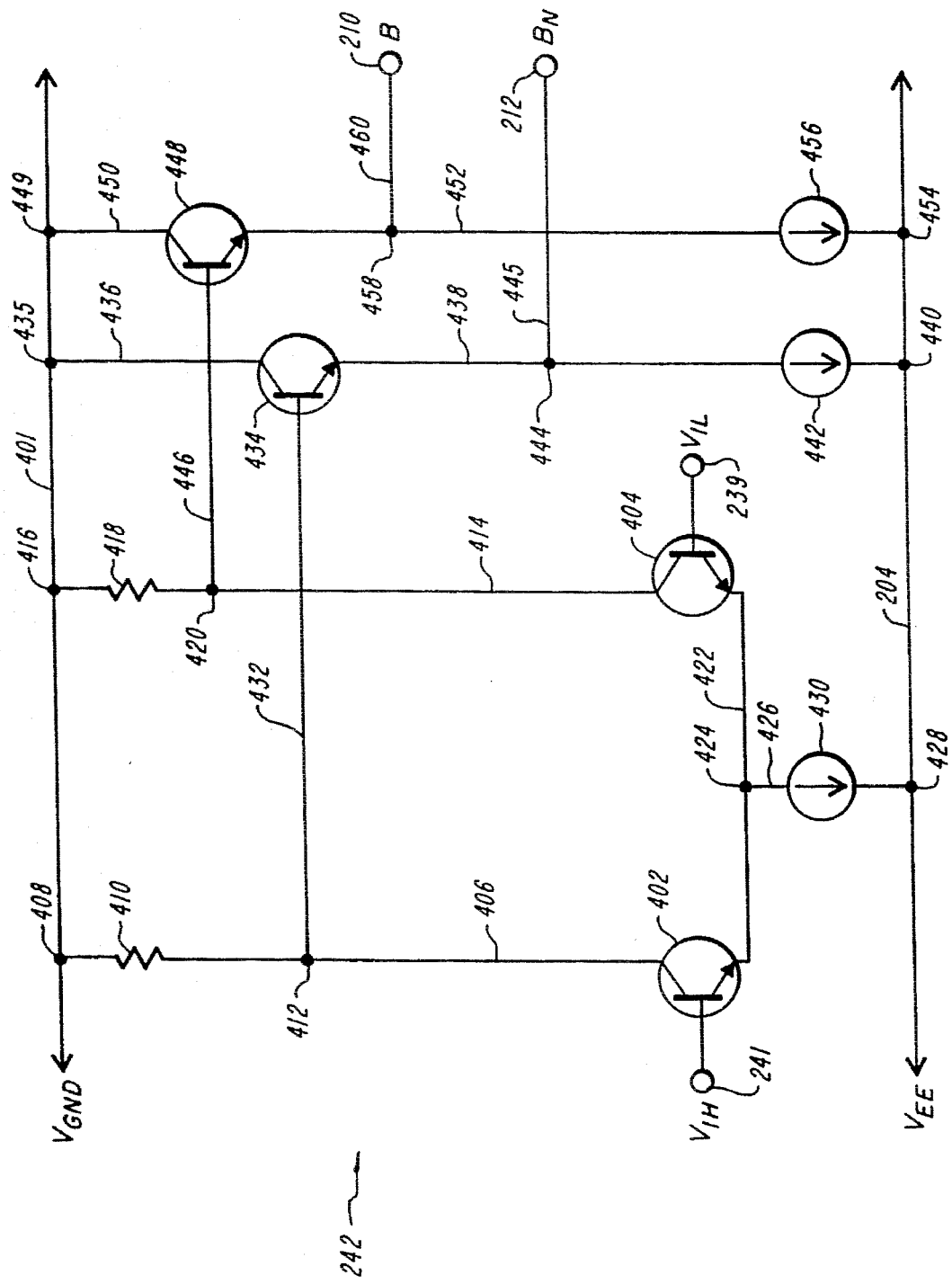
FIG. 4 shows a comparator that may be part of the magamp shown in FIG. 3.

Comparator 242 is shown in FIG. 4. According to FIG. 4, comparator 242 includes a differential input transistor pair, bipolar npn transistors 402 and 404. The $V_{IH}$ input at 241 connects to the base of transistor 402. Line 406 connects the collector of transistor 402 to $V_{GND}$ 401 at node 408. Load resistor 410 is disposed in line 406. Similarly, the $V_{IL}$ input at 239 connects to the base of transistor 404. Line 414 connects the collector of transistor 404 to $V_{GND}$ 401 at node 416. Load resistor 418 is disposed in line 414. The emitters of input transistors 402 and 404 are coupled by line 422. Common node 424 is disposed in line 422. Line 426 connects common node 424 to $V_{EE}$ 204 at node 428. Current source 430 is disposed in line 426. This circuit operates conventionally.

Node 412 is disposed in line 406 between the collector of transistor 402 and load resistor 410. Line 432 connects node 412 to the base of bipolar npn transistor 434. Line 436 connects the collector of transistor 434 to $V_{GND}$ 401 at node 435. Line 438 connects the emitter of transistor 434 to $V_{EE}$ 204 at node 440. Current source 442 is disposed in line 438. Node 444 is disposed in line 438 between transistor 434 and current source 442. Line 445 connects between node 444 and the $B_N$ output of comparator 242 at 212.

Node 420 is disposed in line 414 between the collector of transistor 404 and load resistor 418. Line 446 connects node 420 to the base of bipolar npn transistor 448. Line 450 connects the collector of transistor 448 to $V_{GND}$ 401 at node 449. Line 452 connects the emitter of transistor 448 to $V_{EE}$ 204 at node 454. Current source 456 is disposed in line 452. Node 458 is disposed in line 452 between transistor 448 and current source 456. Line 460 connects between node 458 and the B output of comparator 242 at 210.

Again referring to FIG. 3, the B signal of comparator 242 on line 244 connects to node 248 in line 250. Line 250 connects to node 252 that is disposed in line 254. Line 250 also connects to B output at 210. Line 254 connects to the bases of current switching control transistors 256 and 258.

The $B_N$ signal of comparator 242 on line 246 connects to the base of current switching control transistor 262. Node 260 is in line 246. Line 274 connects node 260 to node 276 in line 278. Line 278 connects to the base of current switching control transistor 280 and also connects to the $B_N$ output at 212.

Line 354 connects node 310 in line 304 to the base of output transistor 356, which is a bipolar npn transistor. Line 358 connects the collector of transistor 356 to node 360 on $V_{CC}$ 202. The emitter of transistor 356 connects to node 364 on $V_{EE}$ 204 via line 362. Current source 366 is disposed in line 362 and node 368 is disposed in line 362 above current 366. Line 371 connects node 368 to the $V_{OL}$ output at 216.

In a similar fashion, line 336 connects node 334 in line 328 to the base of output transistor 338, which is a bipolar npn transistor. Line 346 connects the collector of transistor 338 to node 342 on $V_{CC}$ 202. The emitter of transistor 338 connects to node 347 on $V_{EE}$ 204 via line 344. Current source 348 is disposed in line 344 and node 350 is disposed in line 344 above current source 348. Line 352 connects node 350 to the $V_{OH}$ output at 214.

Line 370 connects to the bases of cascode transistors 302 and 326. Line 370 carries a signal which will bias these transistors to conduct. These transistors are used conventionally.

Line 372 connects to node 300 in line 296 and line 374 connects to node 324 in line 320. Lines 372 and 374 connect to an offset circuit that will pull currents from nodes 300 and 324. Such an offset circuit is disclosed in commonly assigned, copending U.S. patent application Ser. No. 08/347,909, filed Dec. 1, 1994, which is incorporated by reference.

Referring to FIG. 2, the $V_{RIH}$ and $V_{RIL}$ inputs and the $V_{ROH}$ and $V_{ROL}$ outputs are associated with the offset circuit. The two reference inputs to the offset circuit are $V_{REF+}$ and $V_{REF-}$ signals that are input to the $V_{RIH}$ input at 219 and the $V_{RIL}$ input at 221, respectively. These signals set the full scale range of the magamp stage. The two reference signals of the offset circuit that will match the full scale range of the signals output from the $V_{OH}$ and $V_{OL}$ outputs at 214 and 216, respectively, are the signals output from the $V_{ROH}$ output at 223 and the $V_{ROL}$ output at 225. The signals at the $V_{ROH}$ and $V_{ROL}$ outputs are input to the $V_{RIH}$ and $V_{RIL}$ inputs of the next successive magamp stage. The signals input to the $V_{RIH}$ and $V_{RIL}$ inputs are used to pull currents for aligning the folded signals as set forth in the above referenced copending application.

Referring to FIGS. 1–4, when the $V_{IH}$ input at 206 is LOW and the $V_{IL}$ input at 208 is HIGH, as shown in FIG. 1A, the outputs of comparator 242 on line 244 for the B output is LOW and on line 246, the negative true output, for the $B_N$ output is HIGH. This will cause transistors 262 and 280 to conduct, which enables the differential input amplifier consisting of transistors 222 and 230, and resistor 319. As such, the $V_{OL}$ signal will decrease and $V_{OH}$ signal will increase, as shown in FIG. 1C. During this time, transistors 256 and 258 of the current switching control transistors do not conduct.

The intermediate curve shown in FIG. 1B does not occur in the magamp of the present invention because of the currents added at node 298 in line 296 and at node 324 in line 320 from the offset circuit. These offset currents cause the $V_1$ and $V_2$ signals to be aligned as shown in FIG. 1C.

Taking the other extreme, when the $V_{IH}$ input at 206 is HIGH and the $V_{IL}$ input at 208 is LOW, as shown FIG. 1A, the outputs of comparator 242 switch such that the B output on line 244 is HIGH and the $B_N$ output on line 246 is LOW. This will cause transistors 262 and 280 to stop conducting and transistors 256 and 258 to conduct, which enables the differential input amplifier consisting of transistors 224 and 232, and resistor 263. This will result in $V_{OL}$ signal increasing and $V_{OH}$ signal decreasing, as shown in FIG. 1C.

The configuration of the circuit as shown in FIG. 3 is protected from the early voltage, $V_A$, that could be caused by the transistors of the current switching transistors by placing them below the input transistors and not above on the output side. Moreover, the configuration of the magamp in FIG. 3 allows for the selection of gain for each magamp stage. Further, the configuration of the magamp of the present invention permits the latching function may be outside of the comparator and, therefore, outside of the analog path. As such, the latch for the circuit may be connected to the B signal output and the $B_N$ signal output.

The terms and expressions that are used herein are terms of expression and not of limitation. There is no intention in the use of such terms and expressions of excluding the equivalents of the features shown and described, or portions thereof, it being recognized that various modifications are possible in the scope of the invention.

I claim:

1. A magnitude amplifier (magamp), comprising:
   a differential input circuit for receiving and amplifying a differential analog input, with the differential input circuit having a receiving circuit having a first branch and a second branch;
   a current switching control circuit connected to the first and second branches of the differential input circuit on a first side of the receiving circuit, with the current switching control circuit having a first portion connected to the first and second branches of the differential input circuit and a second portion connected to the first and second branches of the differential input circuit, the current switching control circuit for controlling folding of the differential analog input at a predetermined relationship between the signals of the differential analog input;
   a comparator for receiving the differential analog input and generating a first and second output, with a first output controlling first sections of the first and second portions of the current switching control circuit, and the second output controlling second sections of the first and second portions of the current switching control circuit;
   first output means that connects to the first branch on a second side of the receiving circuit, the first output means for providing as an output from the first branch a first output signal generated at least in part under control of the current switching control circuit; and
   second output means that connects to the second branch on the second side of the receiving circuit, the second output means for providing as an output from the second branch a second output signal generated at least in part under control of the current switching control circuit.

2. The magamp as recited in claim 1, wherein the amplifier further includes alignment means that connects to the first and second branches on the second side of the receiving circuit for aligning the first and second output signals such that a magnitude of one of the first and second output signals is changed relative to the other so that a magnitude range of the first output signal is similar to a magnitude range of the second output signal.

3. The magamp as recited in claim 1, wherein the differential input circuit includes a first differential input amplifier with a first and a second branch, and a second differential input amplifier with a first and a second branch.

4. The magamp as recited in claim 3, wherein the first branch of the second differential input amplifier connects to the second branch of the first differential input amplifier on the second side of the receiving circuit and the second branch of the second differential input amplifier connects to the first branch of the first differential input amplifier on the second side of the receiving circuit.

5. The magamp as recited in claim 4, wherein the receiving circuit includes first, second, third, and fourth input transistors.

6. The magamp as recited in claim 5, wherein the first, second, third and fourth input transistors are bipolar npn transistors.

7. The magamp as recited in claim 5, wherein the current switching control circuit includes first, second, third, and fourth control transistors.

8. The magamp as recited in claim 7, wherein the first, second, third and fourth control transistors are bipolar npn transistors.

9. The magamp as recited in claim 7, wherein the first branch of the first differential input amplifier includes the first input transistor for receiving a first signal of the differential analog input at a control lead, a first load resistor on a first side of the first input transistor, and the first control transistor and a first current source on a second side of the first input transistor.

10. The magamp as recited in claim 9, wherein the second branch of the first differential input amplifier includes the fourth input transistor for receiving a second signal of the differential analog input at a control lead, a second load resistor on a first side of the fourth input transistor, and the fourth control transistor and a second current source on a second side of the fourth input transistor.

11. The magamp as recited in claim 10, wherein the first branch of the second differential input amplifier includes the second input transistor for receiving the first signal of the differential analog input at a control lead, the second input transistor coupled to the second load resistor on a first side of the second input transistor, and the second control transistor coupled to the first current source on a first side of the second control transistor and coupled to the second input transistor on a second side of the second control transistor.

12. The magamp as recited in claim 11, wherein the second branch of the second differential input amplifier includes the third input transistor for receiving the second signal of the differential analog input at a control lead, the third input transistor coupled to the first load resistor on a first side of the third input transistor, and the third control transistor coupled to the second current source on a first side of the third control transistor and coupled to the third input transistor on a second side of the third control transistor.

13. An analog to digital converter comprising:

a plurality of cascaded amplifiers, each including:

a receiving circuit for receiving and amplifying a differential analog input, a comparator for receiving the differential analog input, for comparing input signals, and for generating first and second control signals based on the comparison, a current switching control circuit connected to the receiving circuit on a first side, the current switching control circuit for controlling folding of the differential analog input in response to the first and second control signals, and an output circuit, connected to the second side of the receiving circuit, for providing a first output signal and a second output signal, the first and second output signals generated at least in part under control of the current switching control circuit, wherein the amplifiers are cascaded such that the first and second output signals from one amplifier are provided as the differential analog input to a next amplifier; and a gray-to-binary converter coupled to the plurality of cascaded amplifiers for receiving as inputs the first and second control signals from each of the amplifiers, and for providing a parallel digital output.

14. The converter of claim 13, wherein the converter is for converting n-bit words, and wherein there are n-1 cascaded amplifiers, where n is a natural number greater than 2.

15. The converter of claim 14, wherein the amplifiers are arranged from a first to an (n-1)th amplifier, the first amplifier receiving the differential analog input as a first input signal, the converter further comprising a last stage comparator coupled to the (n-1)th amplifier for receiving the first and second output signals from the (n-1)th amplifier and for providing to the gray-to-binary converter an output signal based on the comparison performed by the last stage comparator.

16. The converter of claim 13, wherein the receiving circuit includes first, second, third, and fourth transistors, each of the transistors having a control lead for receiving the differential analog input.

17. The converter of claim 16, wherein the current switching control circuit includes fifth, sixth, seventh, and eighth bipolar transistors, each having one side coupled to the first, second, third, and fourth bipolar transistors, respectively.

18. The converter of claim 17, wherein each of the first through eighth transistors is an npn transistor, the fifth and sixth transistors form a first emitter-coupled differential pair, the seventh and eighth transistors form a second emitter-coupled differential pair, the bases of the fifth and eighth transistors are coupled together, and the bases of the sixth and seventh transistors are coupled together.

19. An amplifier comprising:

a differential input circuit for receiving and amplifying a differential analog input signal;

a comparator for receiving the differential analog input signal and for generating first and second control signals based on the comparison;

a current switching control circuit, connected to a first side of the input circuit, for controlling folding of the differential analog input signal in response to the first and second control signals; and an output circuit, connected to the input circuit on a second side, for providing first and second output signals generated at least in part under control of the current switching control circuit.

20. The amplifier of claim 19, the input circuit including first, second, third, and fourth npn transistors, each having a base for receiving the differential analog input signal, the current switching control circuit including fifth, sixth, seventh, and eighth npn transistors, each having a collector coupled to the emitter of the first, second, third, and fourth transistors, respectively, and the output circuit including ninth and tenth npn transistors, each having an emitter coupled to collectors of the first and third transistors, and to the second and fourth transistors, respectively.

* * * * *